United States Patent
Nagaya et al.

(10) Patent No.: US 8,110,752 B2
(45) Date of Patent: Feb. 7, 2012

(54) WIRING SUBSTRATE AND METHOD FOR MANUFACTURING THE SAME

(75) Inventors: Fusaji Nagaya, Gifu (JP); Nobuhisa Kuroda, Gifu (JP); Atsushi Awano, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 90 days.

(21) Appl. No.: 12/414,137

(22) Filed: Mar. 30, 2009

(65) Prior Publication Data

US 2009/0260853 A1  Oct. 22, 2009

Related U.S. Application Data

(60) Provisional application No. 61/043,190, filed on Apr. 8, 2008.

(51) Int. Cl.
    *H05K 1/11* (2006.01)
(52) U.S. Cl. ........ 174/261; 174/255; 174/257; 174/258; 174/264; 174/265; 361/767; 361/813; 257/734; 257/778; 257/779; 257/781; 428/209; 428/573
(58) Field of Classification Search .................. 174/261, 174/255, 257, 258, 264, 265; 361/767, 813; 257/734, 778, 779, 781; 428/209, 573
    See application file for complete search history.

(56) References Cited

U.S. PATENT DOCUMENTS

| | | | |
|---|---|---|---|
| 4,289,575 A | 9/1981 | Matsumoto et al. | |
| 6,228,466 B1 * | 5/2001 | Tsukada et al. | 428/209 |
| 6,306,685 B1 * | 10/2001 | Liu et al. | 438/121 |
| 6,448,644 B1 * | 9/2002 | Lin | 257/734 |
| 6,534,723 B1 * | 3/2003 | Asai et al. | 174/255 |
| 6,580,036 B2 * | 6/2003 | Kim et al. | 174/261 |
| 6,660,626 B1 * | 12/2003 | Lin | 438/618 |
| 7,015,128 B1 * | 3/2006 | Chiang et al. | 438/612 |
| 7,157,791 B1 * | 1/2007 | Lin | 257/698 |
| 7,245,023 B1 * | 7/2007 | Lin | 257/779 |
| 2004/0040856 A1 * | 3/2004 | Hamano | 205/123 |
| 2004/0086739 A1 * | 5/2004 | Matsumura et al. | 428/573 |

(Continued)

FOREIGN PATENT DOCUMENTS

JP  B-63-18355  4/1988

*Primary Examiner* — Xiaoliang Chen
(74) *Attorney, Agent, or Firm* — Oblon, Spivak, McClelland, Maier & Neustadt, L.L.P.

(57) ABSTRACT

A method for manufacturing a wiring substrate includes forming a conductor circuit on an insulating layer, the conductor circuit including a pad, a circuit pattern connected to the pad, and a lead pattern connected to the pad. A solder resist layer is formed on the circuit pattern and on the insulating layer, and a plating resist layer is formed on the lead pattern and on the insulating layer and forming a metal film on a first portion of the conductor circuit not covered by the solder resist layer and not covered by the plating resist layer. The plating resist layer is removed to expose a second portion of the conductor circuit adjacent to the first portion of the conductor circuit and not covered with the metal film, and an etching resist layer is formed on the metal film and on the second portion of the conductor circuit. A third portion of the conductor circuit not covered by the etching resist layer is removed by etching, and the etching resist is removed. The conductor circuit covered with the etching resist layer is a part of the second portion of the conductor circuit exposed by removing the plating resist.

6 Claims, 6 Drawing Sheets

U.S. PATENT DOCUMENTS

| | | | |
|---|---|---|---|
| 2004/0099961 A1* | 5/2004 | Chu et al. | 257/781 |
| 2004/0169287 A1* | 9/2004 | Honda | 257/778 |
| 2004/0227239 A1* | 11/2004 | Murata et al. | 257/738 |
| 2005/0156326 A1* | 7/2005 | Ito | 257/779 |
| 2005/0253263 A1* | 11/2005 | Sugimoto et al. | 257/737 |
| 2006/0016779 A1* | 1/2006 | Miyagawa et al. | 216/13 |
| 2006/0049516 A1* | 3/2006 | Wang et al. | 257/734 |
| 2006/0223223 A1* | 10/2006 | Okazawa et al. | 438/104 |
| 2006/0289203 A1* | 12/2006 | Oda | 174/264 |
| 2008/0116079 A1* | 5/2008 | Miyagawa et al. | 205/181 |
| 2008/0174981 A1* | 7/2008 | Chan et al. | 361/813 |
| 2009/0027864 A1* | 1/2009 | Cho et al. | 361/767 |
| 2009/0146280 A1* | 6/2009 | Shimazaki et al. | 257/676 |

* cited by examiner (A)

(B)

(A)

(B)

(C)

(A)

(B)

(A)

(B)

WIRING SUBSTRATE AND METHOD FOR MANUFACTURING THE SAME

CROSS-REFERENCE TO RELATED APPLICATIONS

The present application claims the benefits of priority to U.S. Application No. 61/043,190, filed Apr. 8, 2008. The contents of that application are incorporated herein by reference in their entirety.

BACKGROUND OF INVENTION

1. Technical Field

The invention relates to a wiring substrate, and a method for manufacturing a wiring substrate, having a pad covered with a metal film.

2. Description of the Related Art

A pad of a wiring substrate is generally covered with a two-layered Ni/Au plating film for improving connection reliability. The Ni/Au plating film is formed using electrolytic plating in place of electroless plating, in many cases, from an economic point of view. Lead patterns are connected to respective bonding pads so that the pads can be electrically connected to a power supply outside of the wiring substrate for the electrolytic plating process. Portions of the lead patterns are also covered with the Ni/Au film by the plating process. After the plating process, portions of the lead patterns are removed in a removal process to provide the bonding pad. Japanese Patent Application Publication (JP-B) No. 63-18355, for example, discloses a method for removing a lead pattern. The method of JP-B-63-18355 discloses covering a bonding pad with a Ni/Au plating film, using the Ni/Au plating film as an etching resist, and removing a portion of the lead pattern not covered with the Ni/Au plating film by etching. The contents of JP-B-63-18355 are incorporated herein by reference in their entirety.

BRIEF SUMMARY OF EMBODIMENTS OF INVENTION

One aspect of the invention includes a method for manufacturing a wiring substrate, the method includes forming a conductor circuit on an insulating layer, the conductor circuit comprising a pad, a circuit pattern connected to the pad, and a lead pattern connected to the pad. Also included is forming a solder resist layer on the circuit pattern and on the insulating layer, forming a plating resist layer on the lead pattern and on the insulating layer and forming a metal film on a first portion of the conductor circuit not covered by the solder resist layer and not covered by the plating resist layer. The plating resist layer is removed to expose a second portion of the conductor circuit adjacent to the first portion of the conductor circuit and not covered with the metal film, and an etching resist layer is formed on the metal film and on the second portion of the conductor circuit. A third portion of the conductor circuit not covered by the etching resist layer is removed by etching, and the etching resist is removed. The conductor circuit covered with the etching resist layer is a part of the second portion of the conductor circuit exposed by removing the plating resist.

In another aspect of the invention, a wiring substrate includes an insulation layer, a pad formed on the insulation layer and having a first end and a second end opposite to the first end, a circuit pattern connected to the first end of the pad and a conductor connected to the second end of the pad. A solder resist layer is formed on the circuit pattern and on the insulation layer, and a metal film formed on the pad and on a part of the conductor. A surface of the conductor includes a first portion not covered by the metal film and a second portion of the conductor covered by the metal film and connected to the second end of the pad.

In yet another aspect, a wiring substrate includes an insulation layer, a pad formed on the insulation layer and having a first end and a second end opposite to the first end, a circuit pattern connected to the first end of the pad and a lead pattern connected to the second end of the pad. A solder resist layer is formed on the circuit pattern and on the insulation layer, and a metal film is formed on a first portion of the lead pattern and not formed on a second portion of the lead pattern. An etch resist layer is formed on the solder resist layer, on the first portion of the lead pattern having the metal film thereon, and on the second portion of the lead pattern not having the metal film thereon.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS OF INVENTION

Figure 6:
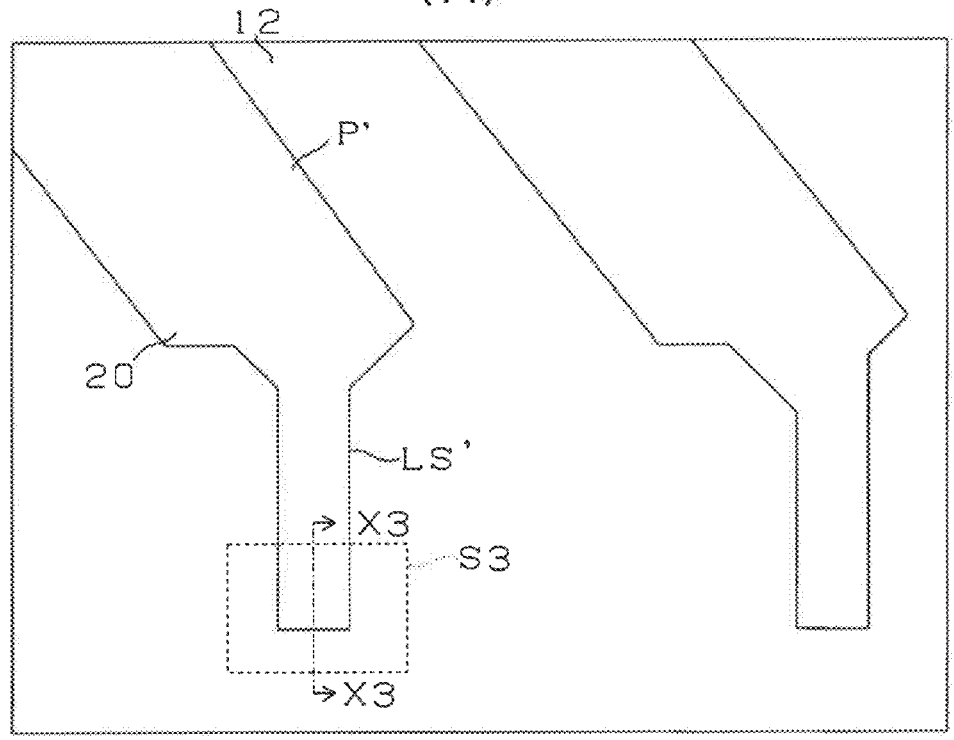
FIG. 6A is a plan view of a bonding pad according to a conventional technique.
FIG. 6B is a sectional view taken along the line X3-X3 of a square portion S3 of FIG. 6A.
Figure 6:
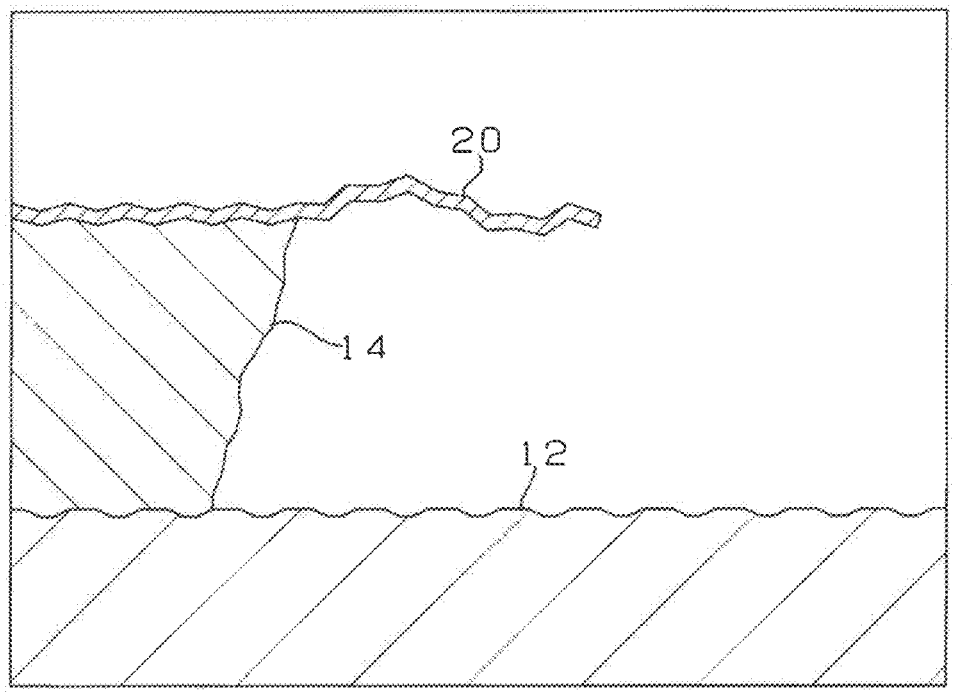

As noted above, JP 63-18355 discloses technology for removing a lead pattern from a bonding pad. The present inventors have recognized that in the removing method disclosed in JP-B-63-18355, when the lead pattern is etched, copper in an end portion of the lead portion covered with the Ni/Au plating film (serving as etching resist) is removed by over etching. Therefore, only the Ni/Au plating film remains in the end portion such that the end portion of the plated lead pattern is made hollow. This state will be described further referring to FIG. 6A, which is a plan view of a bonding pad, and FIG. 6B which shows a cross section taken along the line X3-X3 of a square portion S3 in FIG. 6A. As seen in these figures, a bonding pad P' and a conductor LS' are disposed on a printed wiring board 12, with the surfaces of the underlying bonding pad and lead pattern covered with a Ni/Au plating film 20. In a conventional technique, since the Ni/Au plating film 20 is used as a plating resist, a copper pattern 14 under the Ni/Au plating film 20 is over-etched as shown in FIG. 6B. As a result, only the Ni/Au plating film 20 exists and extends over a void in the end portion. This extending portion may break off and cause problems in the printed wiring board.

Conventionally, since the Ni/Au plating film is thick, the Ni/Au plating film existing at the void may not drop off. However, the present inventors recognized that reduction of the thickness of the Ni-plating film may be performed to miniaturize a wiring pattern. Further, since an alloy of Ni and solder formed on the pad is fragile, reduction of the thickness of the Ni plating may also be required so that the amount of generation of the fragile alloy is reduced. The inventors also recognized that, when the thickness of the Ni plating is reduced, the Ni/Au plating film in the void of the end portion of the lead pattern is likely to drop off and other wirings and bonding pads may be short-circuited.

An object of the present invention, which has been made to address or solve the above problems, is to provide a wiring substrate capable of preventing or reducing occurrence of drop-off of a metal film in a pad covered with the metal film, and a method for manufacturing the wiring substrate.

To achieve the above object, a method for manufacturing a wiring substrate of the present invention has a conductor circuit forming step of forming a conductor circuit composed of a pad, a circuit pattern connected to the pad, and a lead pattern connected to the pad on an insulation layer. A solder resist layer forming step includes forming a solder resist layer on the circuit pattern and on the insulation layer, a plating resist layer forming step includes forming a plating resist layer on the lead pattern and on the insulation layer, a metal film forming step includes forming a metal film on the solder resist layer and on the conductor circuit exposed from the plating resist layer. Also included is a plating resist removing step of removing the plating resist layer, an etching resist forming step of forming an etching resist layer on the metal film and on a conductor circuit connected to the conductor circuit covered with the metal film, a wiring forming step of forming a wiring by removing the conductor circuit exposed from the etching resist layer by etching, and an etching resist removing step of removing the etching resist. The conductor circuit covered with the etching resist layer is a part of the conductor circuit exposed at the plating resist removing step.

To achieve the above object, a wiring substrate of the present invention includes an insulation layer, a pad formed on the insulation layer and having a first end and a second end opposite to the first end, and a circuit pattern connected to the first end of the pad. A conductor is connected to the second end of the pad, a solder resist layer formed on the circuit pattern and on the insulation layer, and a metal film formed on the pad and on a part of the conductor. The surface of the conductor is composed of a portion from which the metal film is exposed and a portion from which the surface of the conductor is exposed, and the conductor covered with the metal film is connected to the second end of the pad.

Where the metal film is formed on the conductor circuit after etching, the metal film is unlikely to be exfoliated from the conductor circuit. Accordingly, short circuit is unlikely to happen between independent wirings, which enables the interval between pads to be reduced. Thus, the thickness of the metal film (in particular, Ni film) can be reduced, and the connection reliability between the electronic parts and the wiring substrate is increased.

Provided is a method for manufacturing a wiring substrate capable of preventing drop-off of a Ni/Au plating film in a bonding pad covered with the Ni/Au plating film. An etching resist is extendingly formed to cover the portion in which the Ni/Au plating film is not formed from the boundary between the portion in which the Ni/Au plating film is formed and the portion in which the Ni/Au plating film is not formed so that a copper is exposed from the portion in which the Ni/Au plating film is formed in the end portion of a lead pattern, thereby to prevent the Ni/Au plating film from being apart from the copper. With this arrangement, short-circuit, which is caused by dropping off and depositing of the Ni/Au plating film, can be prevented.

Figure 5:
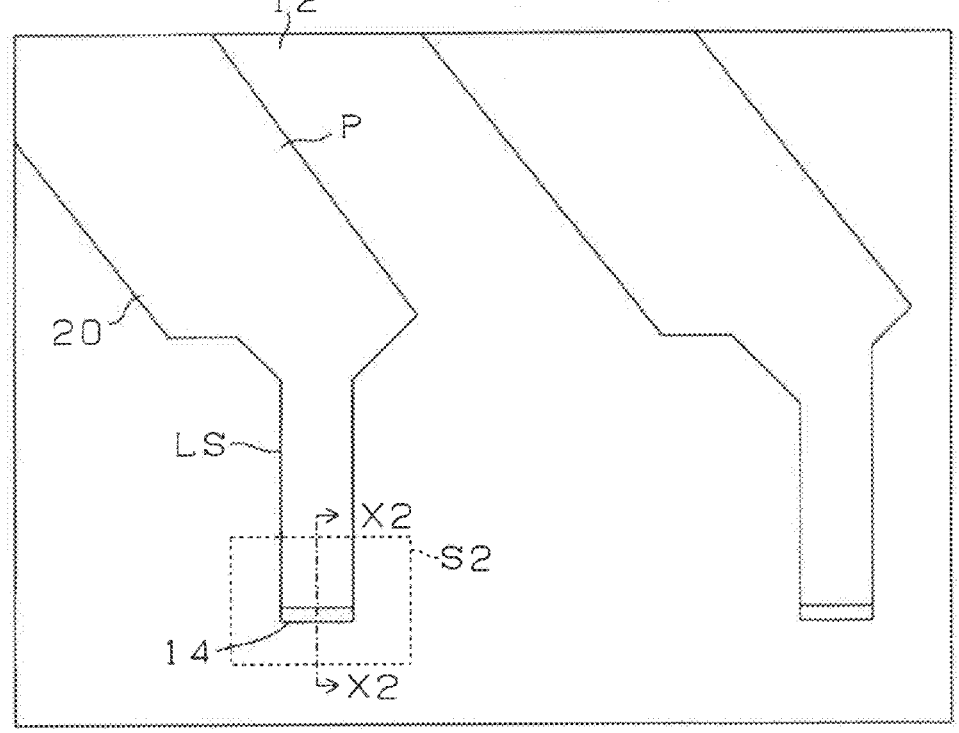
FIG. 5A is a plan view of the bonding pad according to an embodiment of the present invention.
FIG. 5B is a sectional view taken along the line X2-X2 of a square portion S2 of FIG. 5A.
Figure 5:
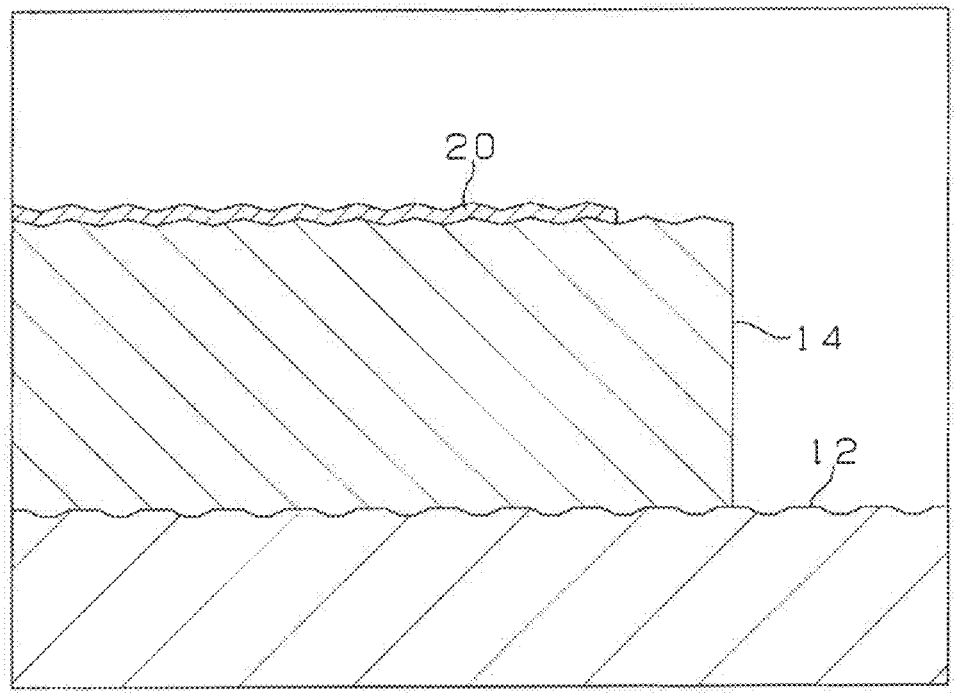

Embodiments of the invention will now be described with reference to the accompanying drawings. Like reference numerals may be used to designate corresponding or identical elements throughout the various drawings. A wiring substrate according to an embodiment of the present invention will be described referring to FIGS. 1 to 5. FIG. 5A is a plan view of the pad manufactured by a method for manufacturing a wiring substrate in accordance with an embodiment. FIG. 5B is a sectional view taken along the line X2-X2 of a square portion S2 of FIG. 5A. The pad P and part of the surface of the conductor LS are covered with the metal film 20. As shown in FIG. 5B, the wiring substrate of this embodiment does not have the metal film 20 in an end portion of the conductor (a part of the lead pattern L) LS. That is, the surface of the conductor circuit 14 is exposed.

Figure 1:
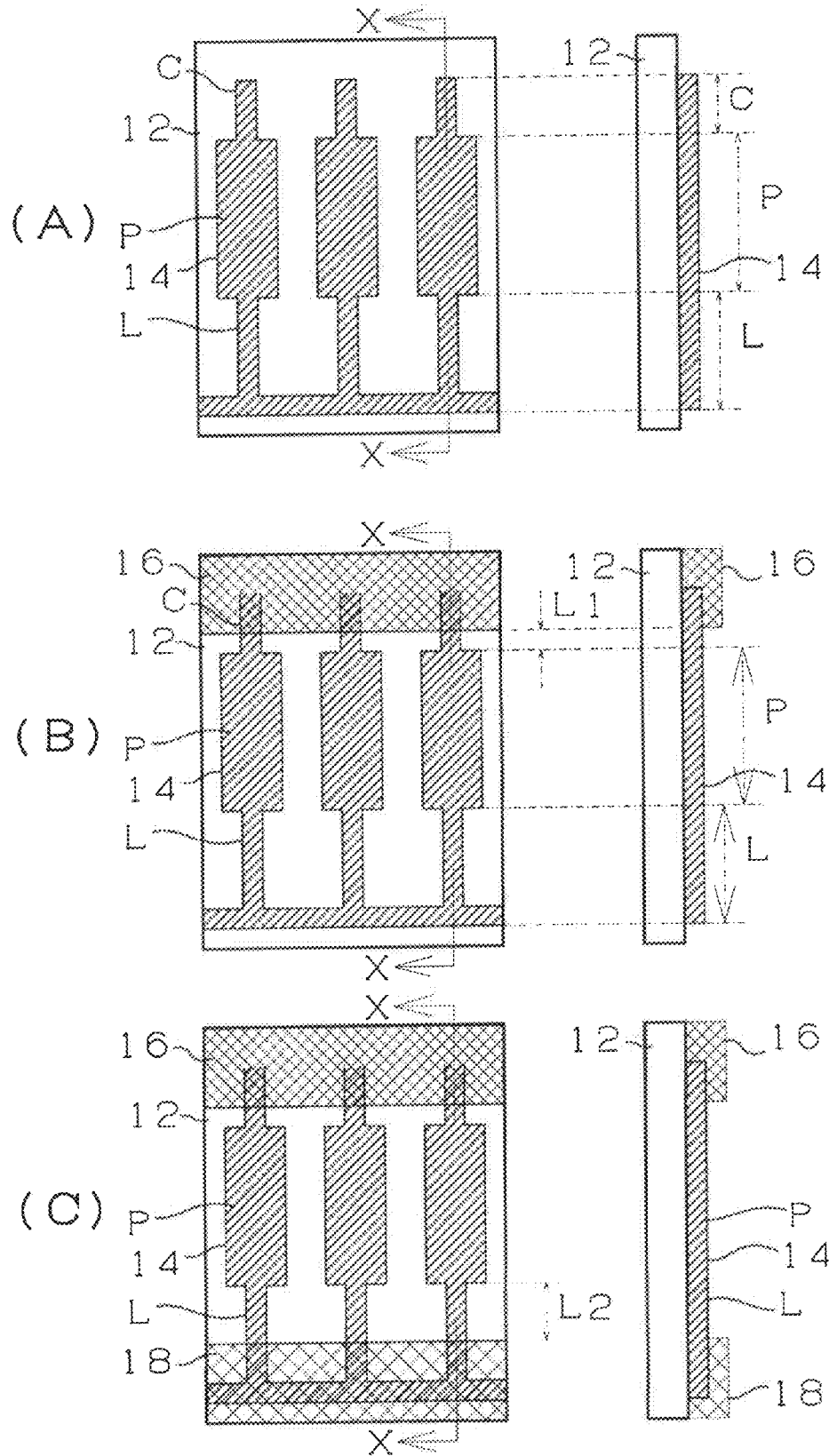
FIGS. 1A to 1C show steps of manufacturing a bonding pad according to an embodiment of the present invention.
Figure 2:
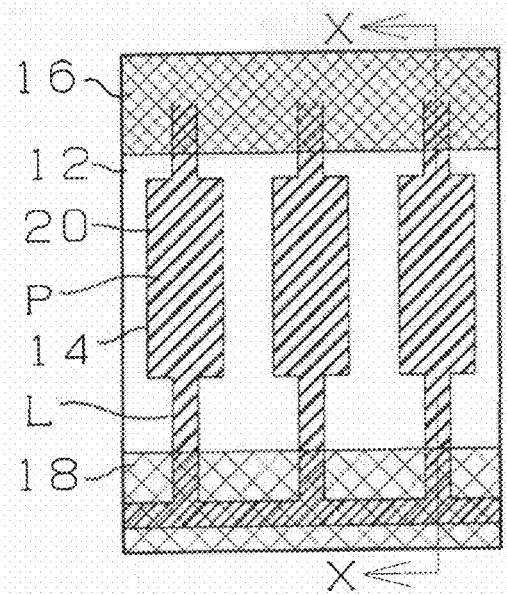
FIGS. 2A and 2B show steps of manufacturing the bonding pad according to an embodiment of the present invention.
Figure 2:
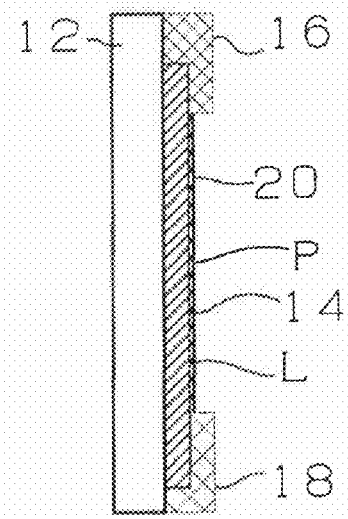
Figure 2:
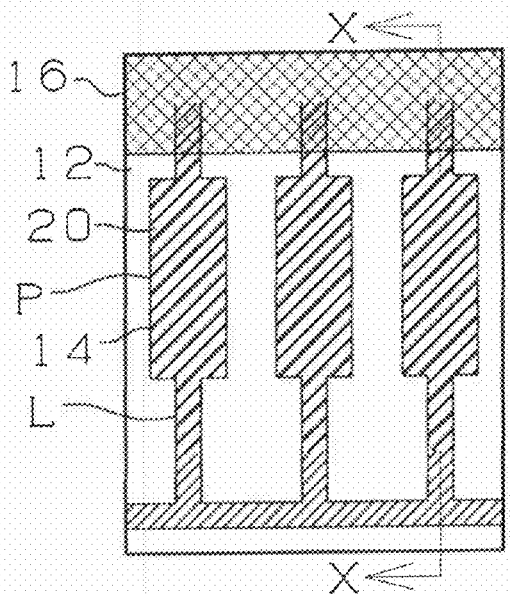
Figure 2:
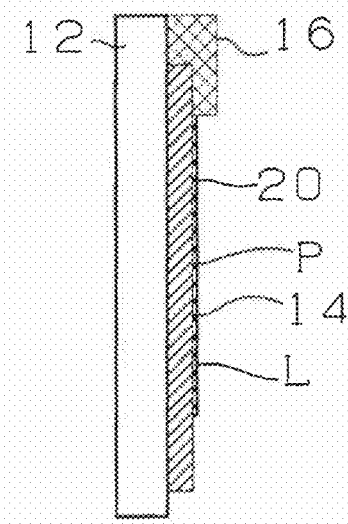
Figure 3:
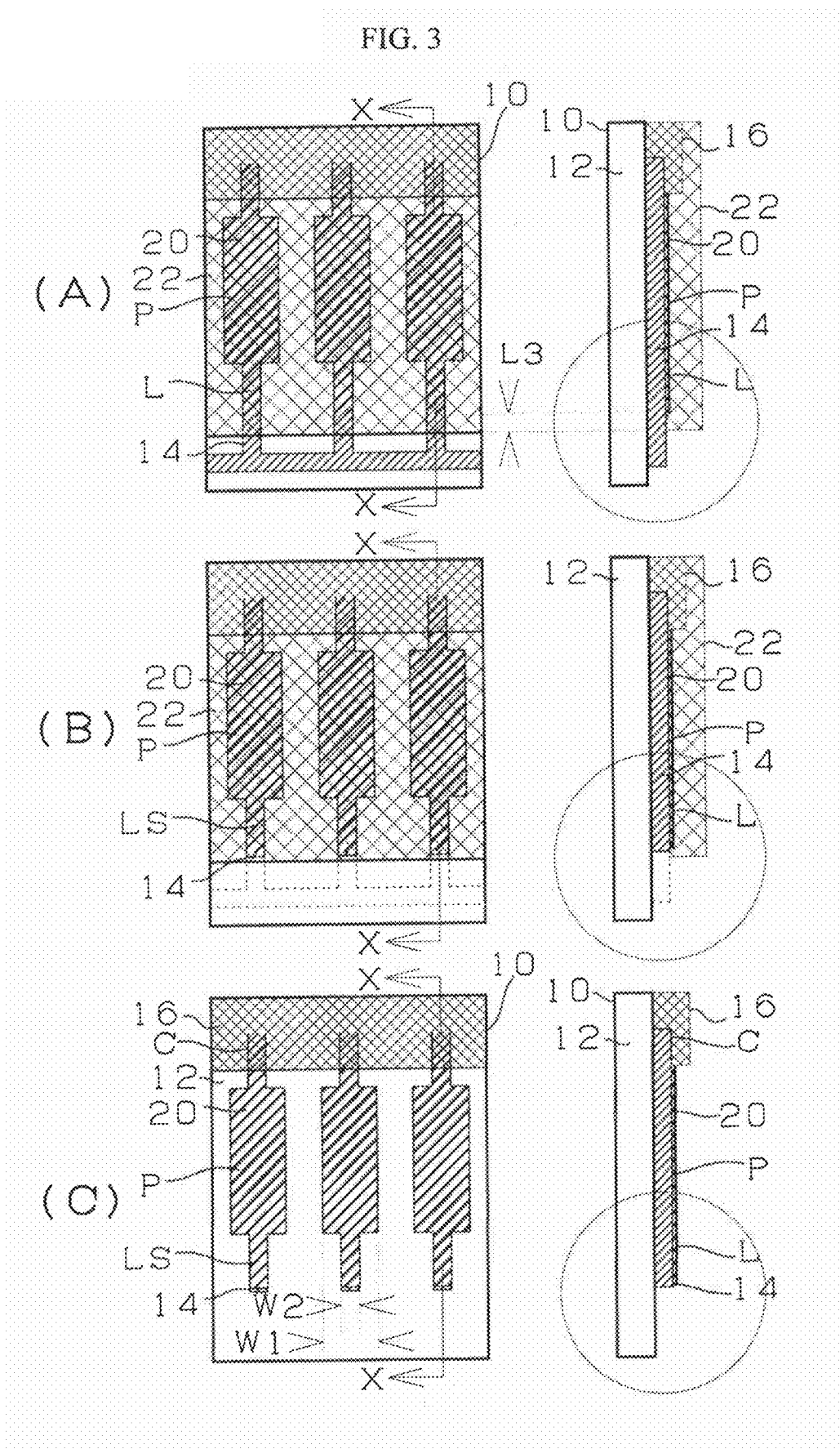
FIGS. 3A to 3C show steps of manufacturing the bonding pad according to an embodiment of the present invention.
Figure 4:
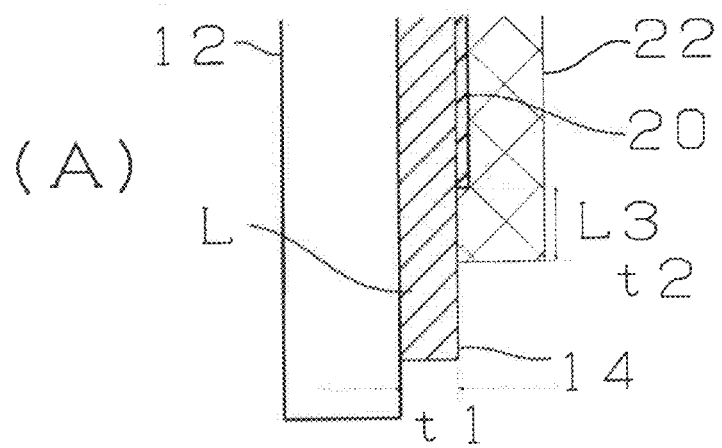
FIGS. 4A to 4C are enlarged explanatory views of a main portion of the bonding pad of FIGS. 3A to 3C, respectively.
Figure 4:
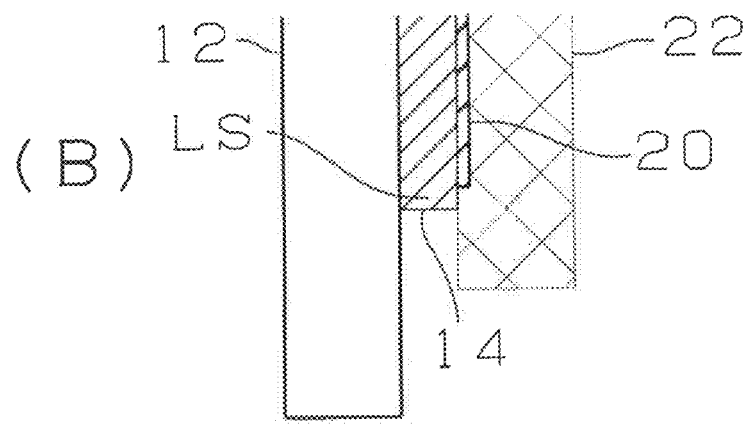
Figure 4:
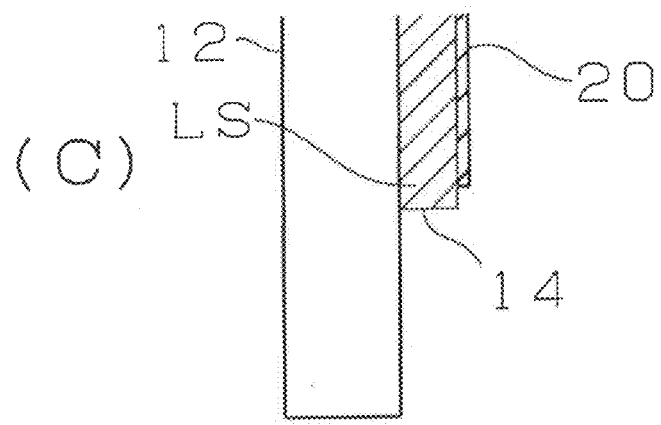

A method for manufacturing the pad described in FIGS. 5A and 5B above will be described referring to FIGS. 1 to 4. The conductor circuit 14 composed of the circuit pattern C (or wiring pattern) having the thickness of about 18 μm, bonding pad P, and the lead pattern L is formed on the insulation layer 12 (FIG. 1A). All the insulation substrates ordinarily used to manufacture a printed wiring board, such as a substrate, on which a glass fabric and a paper impregnated with a thermosetting resin and semi-cured are laminated, can be used as the insulation layer 12. The wiring pattern C includes a terminal for connecting components, a through hole, a line, and the like, and the lead pattern L is a pattern to which the electrically independent bonding pad P is connected for the plating process prior to forming the end product.

The solder resist layer 16 is formed on the circuit pattern C and on the insulation layer 12 (FIG. 1B). It is preferable that the solder resist be not formed in the portion of the circuit pattern having a predetermined length (L1) from the boundary of the pad to the covered circuit pattern. Any material may be used as the solder resist layer as long as it has a resistance to plating and a resistance to heat, and a thermosetting resin mainly composed of epoxy resin is preferable. It is preferable that the predetermined length (L1) be from 5 to 50 μm. The solder resist layer can also be formed on the circuit pattern, on a part of the pad, and on the insulation layer.

A plating resist layer 18 is formed on the lead pattern L and on the insulation layer 12 (FIG. 1C). It is preferable that the plating resist be not formed in the portion of the lead pattern having a predetermined length (L2) from the boundary of the pad P to the covered lead pattern L. It is preferable that the predetermined length (L2) be from 5 to 50 μm. The plating resist layer 18 can also be formed on the lead pattern, on a part of the pad, and on the insulation layer.

The printed wiring board 12 is dipped in an electrolytic Ni plating solution. The printed wiring board 12 is supplied with power through the lead pattern L, and an electrolytic Ni-plating film having a thickness of 0.5 to 3 μm is formed on the conductor circuit which is not covered with the solder resist layer 16 and not covered with the plating resist 18. Further, the printed wiring board 12 is dipped in an electrolytic Au plating solution. The printed wiring board 12 is supplied with power through the lead pattern L, and an electrolytic Au-plating film having a thickness of 0.5 to 2 μm is formed on the electrolytic Ni-plating film. The metal film 20 composed of the Ni/Au plating film is thus formed on the portion of the conductor circuit 14 that is not covered with the solder resist layer 16 and not covered with the plating resist 18 (FIG. 2A).

The electrolytic Ni plating and the electrolytic Au plating are not particularly limited, and sulfamic acid type Ni plating, a watt type Ni plating, and Au plating containing cyan, which are generally used to manufacture a printed wiring board, can be used. Next, the plating resist 18 is exfoliated (FIG. 2B).

Then, an etching resist 22 is formed on the conductor circuit 14 in a portion having a predetermined length (L3) extending from the end portion of the metal film 20 (FIG. 3A). FIG. 4A shows an enlarged view showing the portion surrounded by a circle in the sectional view of FIG. 3A. As shown in FIG. 4A, an etching resist layer 22 is formed on the metal film 20 and the conductor circuit 14. A part of the conductor circuit is exposed from the etching resist layer 22. It is preferable that the predetermined length (L3: refer to FIG. 4A) of the conductor circuit covered with the etching resist be longer than a thickness (t1) of the conductor circuit 14 (wiring). The predetermined length L3 is preferably, for example, 10 to 50 μm or from t1+5 μm to t1+20 μm. In FIG. 4A, the lead pattern L corresponds to the conductor circuit 14. The etching resist 22 is not only formed on the Ni/Au plating film 20 provided on the conductor circuit (lead pattern L), but also directly formed on the conductor circuit (lead pattern portion) 14 which is not covered with the Ni/Au plating film 20. Since the thickness t1 of the conductor circuit (wiring) 14 of the embodiment is 18 μm, it is preferable that the predetermined length of the etching resist (extending length of the etching resist 22) L3, which is formed on the lead pattern on which the metal film is not formed, is 20 to 30 μm which is longer than the thickness t1 of the conductor circuit (wiring).

Returning to FIG. 3B, next, the portion of the conductor circuit exposed from the etching resist layer (portion of the conductor circuit which is not covered with the solder resist layer and not covered with the etching resist layer) is removed by an etching solution (FIG. 3B). In the embodiment, the portion of the lead pattern L on which the etching resist 22 is not formed is removed by etching, thus providing the plated lead LS of FIG. 3B. FIG. 4B is an enlarged view showing the portion surrounded by a circle in the sectional view of FIG. 3B. As shown in FIG. 4B, in the plated lead LS the conductor circuit 14 under the metal film 20 is not etched.

Since the metal film is formed on the conductor circuit (and not extending beyond) in the embodiment of FIG. 3B/4B, it is unlikely to be exfoliated from the conductor circuit. Accordingly, short circuit is unlikely to happen in the manufacturing method of the embodiment. In the embodiment, the resist layer, which is formed on the metal film and on the conductor circuit that is not covered with the metal film, is used as the etching resist layer without using the metal film as the etching resist. Accordingly, when the conductor circuit exposed from the etching resist layer is removed by the etching solution, the conductor circuit under the metal film becomes unlikely to be over-etched (phenomenon that the conductor circuit under an etching mask is removed by the etching solution). This is because, when the conductor circuit directly covered with the etching resist layer is not removed by the etching solution, the etching solution does not reach the conductor circuit under the metal film.

It is preferable that the predetermined length (L3) of the etching resist layer for covering the conductor circuit which is not covered with the metal film be longer than the thickness (t1) of the conductor circuit (wiring) as described above. When the condition L3>t1 is established, the terminal end portion of the wiring (end portion of one wiring on the side on which the pad is formed) is likely to remain not covered with the metal film. The wiring covered with the metal film is directly connected to the terminal end portion of the wiring. Accordingly, the metal film is formed on the wiring (conductor circuit), making itself unlikely to be exfoliated from the wiring (conductor circuit).

Next, the etching resist 22 is exfoliated, and the wiring substrate having the wiring is formed. The metal film and a part of the wiring are exposed by removing the etching resist (FIG. 3C). FIG. 4C is an enlarged view showing the portion surrounded by a circle in the sectional view of FIG. 3C. As shown in FIG. 4C, the surface of the wiring connected to the wiring covered with the metal film is exposed. The wiring under the metal film is not over-etched. FIG. 4C shows an example in which the copper pattern 14 is exposed from the Ni/Au plating film 20 in the extreme end (upper surface, side surface) of the plated lead pattern (conductor) LS in an embodiment of the invention, after etching.

Specifically, FIG. 3C shows a plan view of the wiring substrate 10 on a left side and a cross section of the plan view taken along a line X-X on a right side. The wiring substrate 10 has an insulation resin substrate (insulation layer) 12 and conductor circuits 14 formed on the insulation layer. Each conductor circuit 14 is composed of a pad P, a circuit pattern C for connecting the pad P to an unillustrated circuit side of the wiring substrate, and a conductor LS. The pad P is used to electrically connect the wiring substrate to electronic parts such as a semiconductor chip and the like, and wire bonding connection and flip chip connection are used to connect the electric parts. The conductor LS is formed from a part of a lead pattern, as described above, for supplying power to the pad P. It is preferable that the conductor circuit 14 be made of copper. A solder resist layer 16 is formed on the circuit pattern C. A metal film 20 is formed on a part of the circuit pattern C, on the pad P, and on a part of the surface of the conductor LS. In the embodiment of FIG. 3C, only a part of the conductor circuit 14 is covered by plating 20 to form the conductor LS.

As noted above, FIG. 4C is an enlarged view showing the portion of the wiring substrate 10 surrounded by a circle in the sectional view of FIG. 3C. The conductor LS is composed of the part of the conductor circuit 14 covered with the metal film 20 and the portion of the conductor circuit 14 whose surface is exposed (not covered with film 20). That is, the end portion of the conductor LS is not covered with the metal film 20 so that the upper surface and the side surface of the conductor circuit 14 are exposed. The length of the end portion of the conductor LS which is not covered with the metal film is preferably equal to or less than the thickness of the conductor circuit 14. The length of the end portion of the conductor LS which is not covered with the metal film is preferably about 5 to 40 μm. In the embodiments, since the metal film 20 is formed on (and does not extend beyond) the conductor circuit 14, it is unlikely to be exfoliated from the wiring. Accordingly, short circuit is unlikely to happen between independent wirings. Further, the thickness of the metal film (in particular, Ni film) can be reduced, while the connection reliability between the electronic parts and the wiring substrate can be improved over conventional techniques.

The width of the conductor LS is preferably smaller than the width of the pad P. Since the interval between the adjacent conductors LS is increased, migration is unlikely to happen in the conductor which is not covered with the metal film 20. The width of the conductor LS is preferably one-sixth to two-third the width of the pad P.

In FIG. 3C, the solder resist layer 16 covers a part of the circuit pattern C (the solder resist layer is not formed on the circuit pattern C on the side thereof connected to the pad P). The solder resist layer 16 may cover the entire portion of the circuit pattern C except the pad P and the conductor LS or may cover the circuit pattern and a part of the pad on the side thereof to which the circuit pattern is connected.

In FIG. 3C, the metal film 20 is formed on the pad, on a part of the circuit pattern C, and on a part of the surfaces (upper surface and side surface) of the conductor LS. That is, the part of the circuit pattern C is covered with the metal film. The portion of the circuit pattern C covered with the metal film is the circuit pattern on the side thereof connected to the pad. The length of the circuit pattern C covered with the metal film is preferably 50 μm or less.

A part of the conductor LS is covered with the metal film 20. The part of the conductor LS covered with the metal film 20 is the conductor LS on the side connected to the pad P. The length of the conductor LS covered with the metal film is preferably 50 μm or less. The metal film may be formed on a part of the surface of the pad or solely thereon. Further, the metal film may be formed on a part of the surface of the pad and the conductor or on the pad and a part of the circuit pattern.

In the wiring substrate of the embodiment shown in FIG. 3C, the pads P have a width (W1) of 100 μm and are disposed at the interval of 100 μm. The conductor (part of the lead pattern L) LS has a width (W2) formed to 20 μm. The thickness of the conductor circuit 14 is 18 μm. Since the portion of the conductor, in which the metal film is not formed, has a width smaller than that of the pad P, the interval between adjacent conductors is increased. Accordingly, migration is unlikely to happen in the portion in which the surface of the conductor circuit is exposed.

In the wiring substrate 10 of the embodiment, the end portion of the conductor LS has an exposed portion which is not covered with the metal film 20. With this arrangement, the metal film 20 can be prevented from being easily exfoliated from the wiring. Accordingly, the independent wirings can be prevented from being short-circuited by the metal film.

EXAMPLE

An 18 μm thick copper foil was laminated on a first surface of a 0.6 mm thick prepreg and heated and pressed. The copper foil was patterned using a subtractive process, and a conductor circuit composed of a circuit pattern, a pad, and a lead pattern was formed on an insulation layer. The conductor circuit had a thickness of 18 μm. Next, a solder resist layer was formed on the insulation layer and on the circuit pattern. The solder resist layer partially covered the circuit pattern and it did not cover the circuit pattern in the portion within the range of 30 μm from the boundary between the pad and the circuit pattern. A plating resist layer was formed on the insulation layer and on the lead pattern. The plating resist layer partially covered the lead pattern and did not cover the lead pattern in the portion within the range of 30 μm from the boundary between the pad and the lead pattern. A Ni-plating film and an Au-plating film were formed on the surfaces (upper surface and side surface) of the conductor circuit which was not covered with the solder resist layer or the plating resist layer. The Ni-plating film and the Au-plating film had a thickness of 1 to 2 μm. The plating resist layer was removed. Next, an etching resist layer was formed on the solder resist layer, the insulation layer, the metal film, and the lead pattern. The lead pattern was covered with the etching resist layer in the portion within the range of 50 μm from the boundary between the pad and the lead pattern. The lead pattern exposed from the etching resist was removed by an etching solution. Thereafter, the wiring was formed by removing the etching resist. The wiring portion under the Ni/Au film (metal film) was not dissolved and removed by the etching solution.

Thus, an embodiment includes a method for manufacturing a wiring substrate capable of preventing drop-off of a Ni/Au plating film in a bonding pad covered with the Ni/Au plating film. An etching resist is extendingly formed to cover the portion in which the Ni/Au plating film is not formed from the boundary between the portion in which the Ni/Au plating film is formed and the portion in which the Ni/Au plating film is not formed so that a copper is exposed from the portion in which the Ni/Au plating film is formed in the end portion of a lead pattern, thereby to prevent the Ni/Au plating film from being apart from the copper. With this arrangement, short-circuit, which is caused by dropping off and depositing of the Ni/Au plating film, can be prevented.

Although the embodiment described above shows the example for applying the arrangement of the present invention to the bonding pad composed of the copper pattern formed onto the resin printed wiring board, the arrangement of the present invention can also be applied when a metal film is formed on a baked and metallized wiring on a ceramic substrate.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring substrate comprising:
   an insulation layer;
   a pad formed on the insulation layer and having a first end and a second end opposite to the first end;
   a circuit pattern connected to the first end of the pad;
   a conductor connected to the second end of the pad;
   a solder resist layer formed on the circuit pattern and on the insulation layer; and
   a metal film formed on the pad and on a part of the conductor,
   wherein a surface of the conductor comprises a first portion not covered by the metal film, a second portion of the conductor covered by the metal film and connected to the second end of the pad, and wherein the first portion of the conductor includes a terminal end of the conductor which is distal to the second portion of the conductor, said solder resist layer not formed on said terminal end.

2. The wiring substrate according to claim 1, wherein the length of the first portion of the conductor is 5 to 40 μm.

3. The wiring substrate according to claim 1, wherein a width of the pad is larger than a width of the circuit pattern.

4. The wiring substrate according to claim 1, wherein a width of the pad is larger than a width of the conductor.

5. The wiring substrate according to claim 1, wherein a width of the pad is larger than widths of each of the circuit pattern and the conductor.

6. The wiring substrate according to claim 1, wherein a width of the conductor is smaller than the width of the pad.

* * * * *